(12) United States Patent
Wang et al.

(10) Patent No.: US 8,546,226 B2
(45) Date of Patent: Oct. 1, 2013

(54) SONOS NON-VOLATILE MEMORY CELL AND FABRICATING METHOD THEREOF

(75) Inventors: Chih-Ming Wang, Tainan (TW); Ping-Chia Shih, Tainan (TW); Chun-Sung Huang, Changhua County (TW); Chi-Cheng Huang, Kaohsiung (TW); Hsiang-Chen Lee, Kaohsiung (TW); Chih-Hung Lin, Hsinchu (TW); Yau-Kae Sheu, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 79 days.

(21) Appl. No.: 13/189,632

(22) Filed: Jul. 25, 2011

(65) Prior Publication Data

US 2013/0026557 A1    Jan. 31, 2013

(51) Int. Cl.
*H01L 21/336*    (2006.01)
*H01L 29/792*    (2006.01)

(52) U.S. Cl.
USPC ............ 438/287; 257/324; 257/E21.423; 257/E29.309

(58) Field of Classification Search
USPC ................................................ 257/324
See application file for complete search history.

(56) References Cited

U.S. PATENT DOCUMENTS

| | | | |
|---|---|---|---|
| 7,071,063 B2 | 7/2006 | Shih et al. | |
| 7,488,645 B2 | 2/2009 | Lee | |
| 2002/0132430 A1* | 9/2002 | Willer et al. | 438/262 |
| 2007/0200179 A1 | 8/2007 | Chen | |
| 2008/0061361 A1* | 3/2008 | Lee et al. | 257/324 |
| 2008/0081415 A1 | 4/2008 | Lee | |
| 2008/0096351 A1* | 4/2008 | Kim et al. | 438/257 |
| 2008/0128774 A1 | 6/2008 | Irani et al. | |
| 2009/0175089 A1* | 7/2009 | Eitan et al. | 365/185.28 |
| 2009/0242961 A1 | 10/2009 | Tang et al. | |

* cited by examiner

*Primary Examiner* — Jarrett Stark
*Assistant Examiner* — Lawrence Tynes, Jr.
(74) *Attorney, Agent, or Firm* — WPAT, PC; Justin King

(57) ABSTRACT

A method for fabricating a silicon-oxide-nitride-oxide-silicon (SONOS) non-volatile memory cell, wherein the method comprises steps as following: a pad oxide layer and a first hard mask layer are sequentially formed on a substrate. The pad oxide layer and the first hard mask layer are then etched through to form an opening exposing a portion of the substrate. Subsequently, an oxide-nitride-oxide (ONO) structure with a size substantially less than or equal to the opening is formed to coincide with the portion of the substrate exposed from the opening.

10 Claims, 13 Drawing Sheets

SONOS NON-VOLATILE MEMORY CELL AND FABRICATING METHOD THEREOF

FIELD OF THE INVENTION

The present invention relates to a non-volatile memory cell and the fabricating method thereof, more particularly to a silicon-oxide-nitride-oxide-silicon (SONOS) non-volatile memory cell and the fabricating method thereof.

BACKGROUND OF THE INVENTION

Non-volatile memory cells are widely used because they can store data even when the power supply is cut off. Generally, non-volatile memory cells can be sub-classified into two types, floating-gate structure and SONOS structure. The floating-gate structure utilizes source side injection (SSI) or tunneling effect leading hot electrons stored in the floating gate. However, the application of the floating-gate structure is increasingly difficult day after day, because of the hot electrons punching through along the select gate channel as the source-drain channel length shrinks. In comparison with the floating-gate structure, the SONOS structure which also leads hot electrons stored in a silicon nitride layer can be manufactured in a smaller size. Therefore, there is a prevailing tendency today to replace the floating-gate structure with the SONOS structure.

However, to avoiding adjacent two SONOS non-volatile memory cells overlapping with each other during the manufacturing process for forming an electric device involving a plurality of SONOS non-volatile memory cells, some dimension tolerance is usually reserved in the layout pattern of the electronic device to meet the process margin resulted from the prior manufacturing method. Thus it is hard to decrease the distance between the two adjacent SONOS non-volatile memory cells and the device integrity may not be increased.

Therefore, it is necessary to provide an advanced method for fabricating a SONOS non-volatile memory cell to obviate the drawbacks and problems encountered from the prior art.

SUMMARY OF THE INVENTION

In accordance with one aspect of the present invention, a method for fabricating a SONOS non-volatile memory cell is provided, wherein the method comprises steps as following: a pad oxide layer and a first hard mask layer are sequentially formed on a substrate. The pad oxide layer and the first hard mask layer are then etched through to form an opening exposing a portion of the substrate. Subsequently, an ONO structure with a size less than or equal to the opening is formed to coincide with the portion of the exposed substrate.

In one embodiment of the present invention, the first hard mask layer is a nitride layer, and preferably has a thickness substantially greater than that of the ONO structure. In some preferred embodiments, the first hard mask layer has a thickness substantially ranging from 450 Å to 600 Å.

In one embodiment of the present invention, the formation of the opening comprises steps of: etching through the first hard mask layer to expose a portion of the pad oxide; performing an ion implant process on the exposed pad oxide; and removing the exposed pad oxide layer to expose the substrate. In one embodiment of the present invention, the formation of the opening comprises steps of removing the exposed pad oxide layer by a buffer oxide etchant (BOE).

In one embodiment of the present invention, the formation of the ONO structure comprises steps as following: A ONO layer is firstly formed on the first hard mask and the exposed substrate. A second hard mask layer is then formed on the ONO layer. A chemical mechanical polishing (CMP) process is subsequently carried out by using the first hard mask as a polishing stop layer. Next, the first hard mask layer remaining on the pad oxide layer, the second hard mask layer remaining on the ONO layer and the pad oxide layer remaining on the substrate are removed. In one embodiment of the present invention, the second hard mask layer is an oxide layer formed by a thermal oxidation process. In one embodiment of the present invention, the first hard mask layer is removed by a reagent containing hot $PO_4H_3$. In one embodiment of the present invention, the second hard mask layer and the pad oxide layer are removed by a RCA cleaning process.

In one embodiment of the present invention, after the ONO structure is formed, the method further comprising steps of forming a gate oxide layer conformal to the substrate and the ONO structure; forming a gate electrode on the gate oxide layer; and forming a source/drain in the substrate.

In accordance with another aspect of the present invention, a SONOS non-volatile memory cell is provided, wherein the SONOS non-volatile memory cell comprises a substrate, an ONO structure, a gate oxide layer, a gate electrode and a source/drain. The ONO structure blankets over a surface of the substrate. The gate oxide layer is conformal with the surface of the substrate and the ONO structure. The gate electrode is disposed on the gate oxide layer and the source/drain is disposed in the substrate.

In accordance with the aforementioned embodiments of the present invention, an etching process is performed to form an opening penetrating through a pad oxide layer and a nitride hard mask layer so as to expose a substrate, and a CMP process is then carried out by using the hard mask as a polishing layer to pattern an ONO layer subsequently formed on the nitride hard mask layer and filled in the opening, thereby an ONO structure with a size substantially less than or equal to the opening directly blanket over the exposed portion of the substrate is formed, instead of using two etching process to form the opening and pattern the ONO layer, like the prior art dose.

Because the ONO structure substantially coincides with the opening. Therefore, the process margin resulted from the formation processes of the ONO structure and the opening is no more necessary to be considered while manufacturing the SONOS non-volatile memory cell, such that the feature size of an individual SONOS non-volatile memory cell fabricated on an electronic device can be minimized and the integrity of the electronic device can be increased. In addition, because the substrate exposed by the opening is blanketed by the ONO layer when the hard mask is removed by using hot $PO_4H_3$ serves as the etchant, the exposed substrate thus can be prevented from damage of the hot $PO_4H_3$ and it is no more necessary to require additional $PO_4H_3$ cleaning processes. Furthermore, because the etching step for patterning the ONO layer is substituted by the CMP process, the cost of the photolithographic steps and masks can thus be reserved and the yield may be increased. Therefore, drawbacks and problems encountered from the prior art can be solved and the aforementioned objections can be achieved.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention is to provide an advanced method for fabricating a SONOS non-volatile memory cell to improve the yield and density of the SONOS non-volatile memory cells fabricated on the same device, meanwhile, the manufacturing cost may be reduced.

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
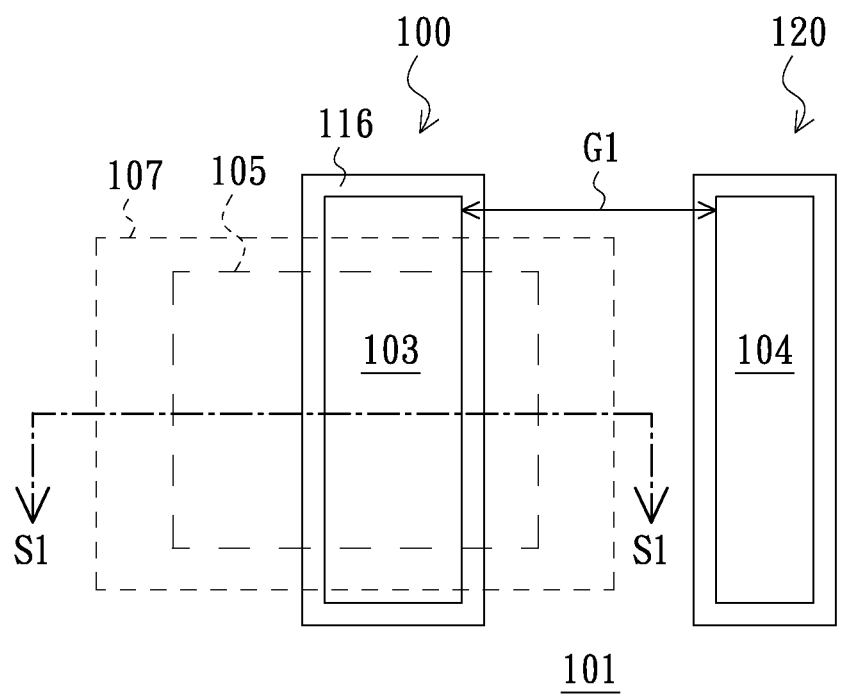
FIG. 1 illustrates a top view of two adjacent SONOS non-volatile memory cells.
Figure 1A:
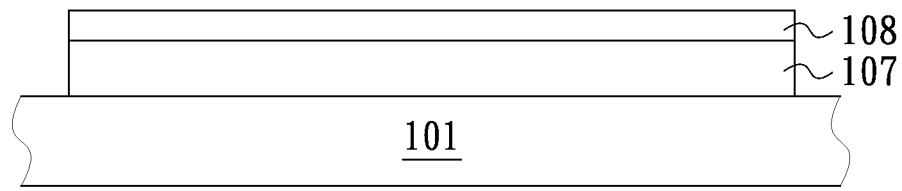
FIGS. 1A to 1K are cross sectional views depicted along a section line S1 to illustrate the method for fabricating the SONOS non-volatile memory cell as shown in FIG. 1.
Figure 1B:
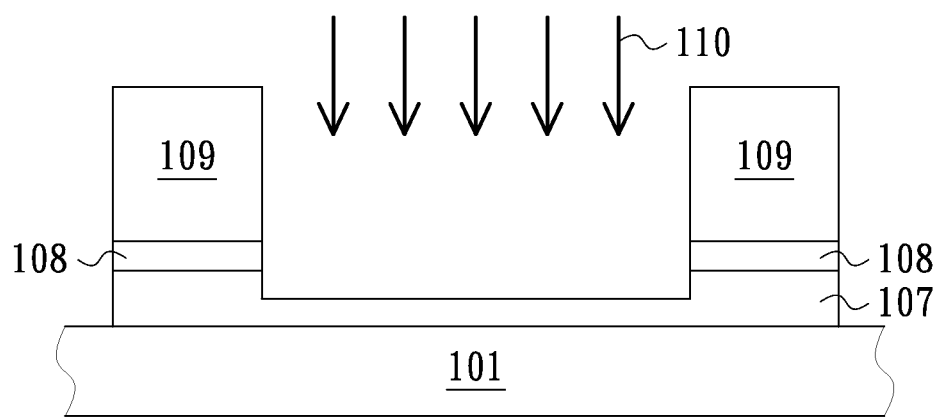
Figure 1C:
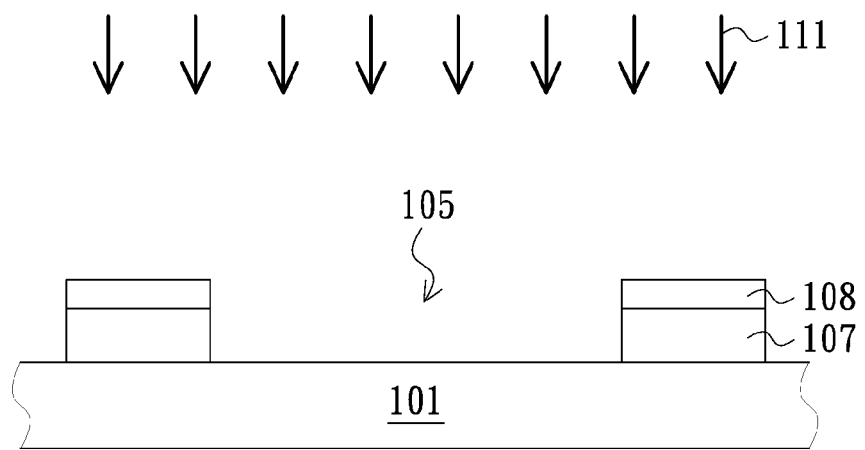
Figure 1D:
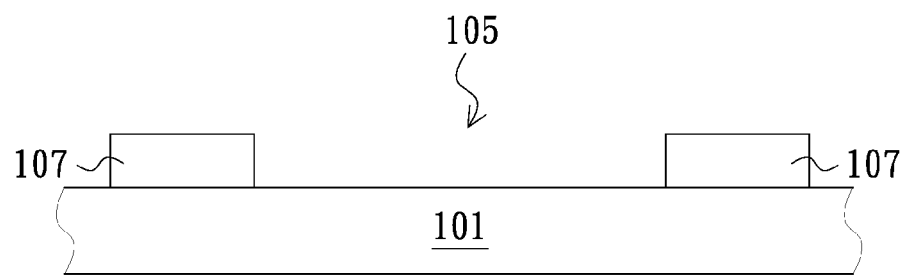
Figure 1E:
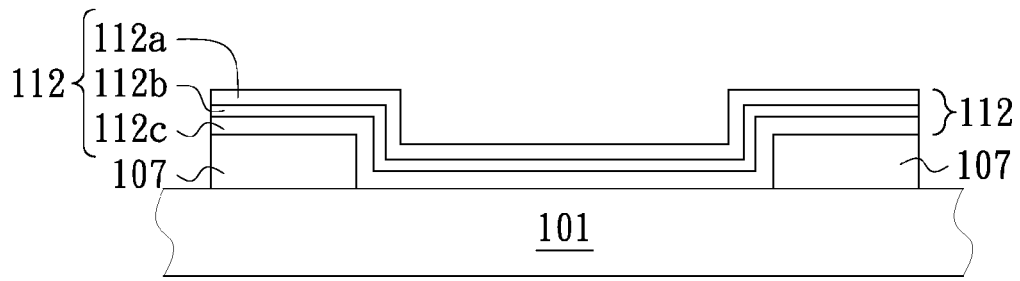
Figure 1F:
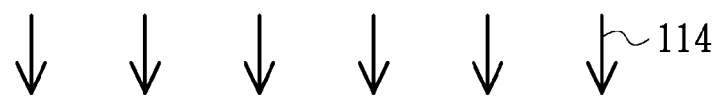
Figure 1F:
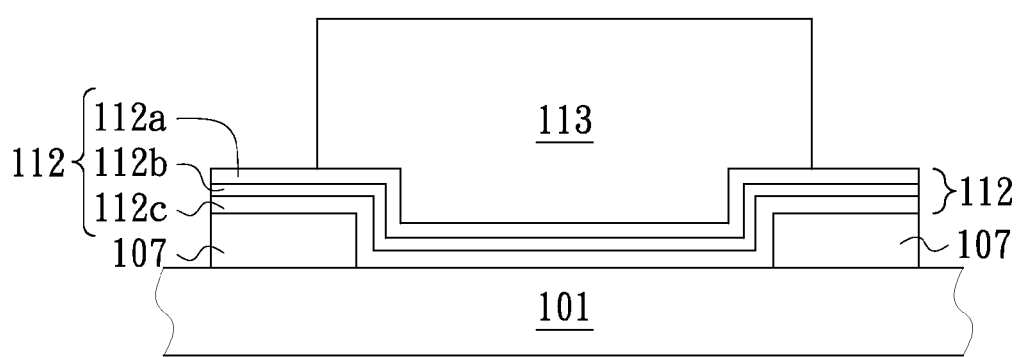
Figure 1G:
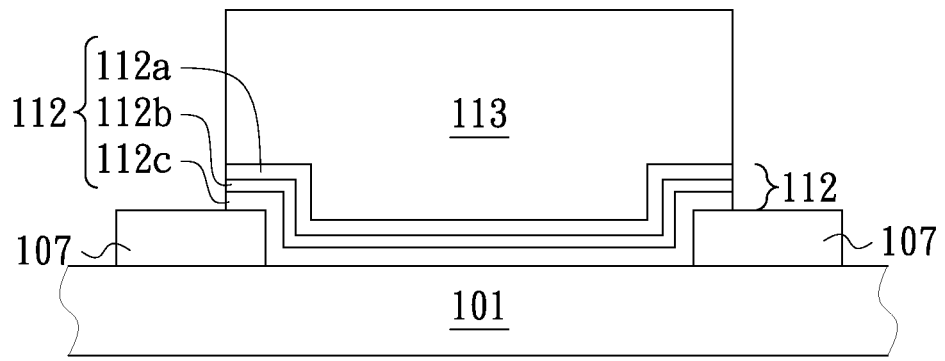
Figure 1H:
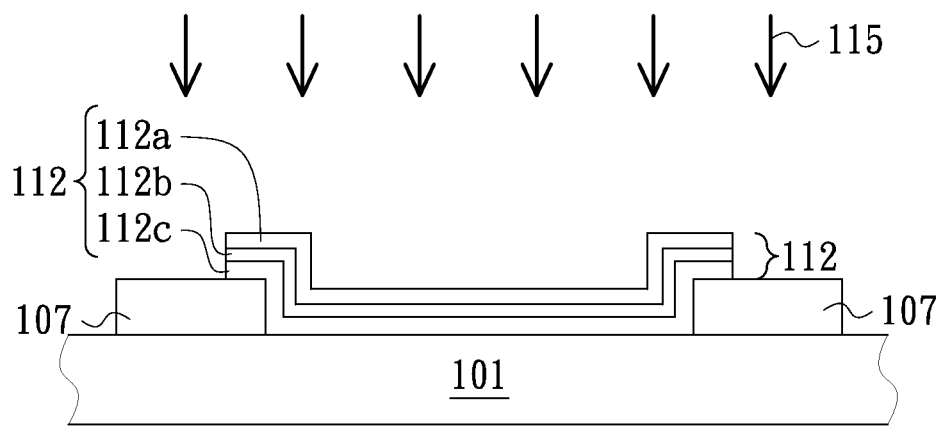
Figure 1I:
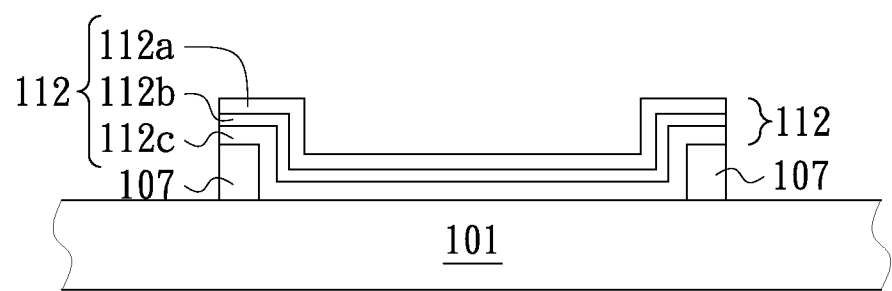

FIG. 1 illustrates a top view of two adjacent SONOS non-volatile memory cells 100 and 120. FIGS. 1A to 1K are cross sectional views depicted along the section line S1 to illustrate the method for fabricating the SONOS non-volatile memory cell 100 as shown in FIG. 1. The method for fabricating the SONOS non-volatile memory cell 100 comprises steps as following: Firstly, a substrate 101 is provided. A pad oxide layer 107 and a nitride hard mask layer 108 is then sequentially formed on the substrate 101 (as shown in FIG. 1A). Next, a photoresist 109 is formed on the hard mask layer 108 and a photolithography process 110 (as shown in FIG. 1B) is then performed to form an opening penetrating through the hard mask layer 108 and the pad oxide layer 107 to expose a portion of the substrate 101 (as shown in FIG. 1C). Subsequently, the remaining hard mask 108 is removed by an etchant 111 containing phosphoric acid ($PO_4H_3$) (as shown in FIG. 1D). Afterward, an oxide layer 112c, a nitride layer 112b and another oxide layer 112a are sequentially formed on the pad oxide layer 107 and the exposed portion of the substrate 101 (as shown in FIG. 1E), wherein the combination of these three layers are referred as an oxide-nitride-oxide (ONO) layer 112. Another photoresist 113 is then formed on the ONO layer 112 and a patterning process by using the photoresist 113 serves as a mask is carried out on the ONO layer 112 (as shown in FIG. 1F), thereby an ONO structure as shown in FIG. 1G is formed. A RCA cleaning process 115 (as shown in FIG. 1H) is then performed to clean the ONO structure and remove the portion of the pad oxide which are not covered by the ONO structure (as shown in FIG. 1I).

Figure 1J:
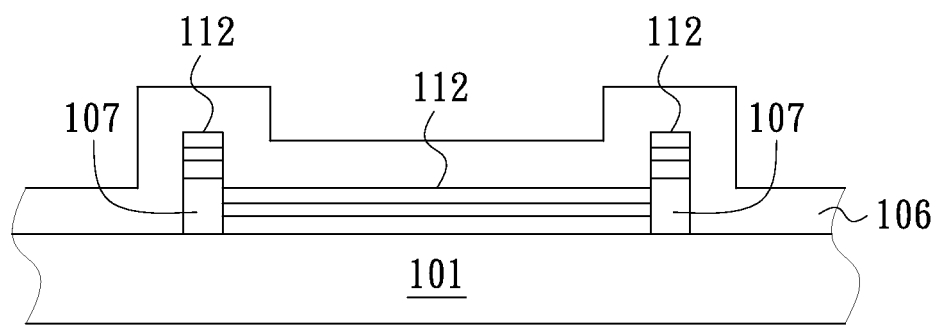
Figure 1K:
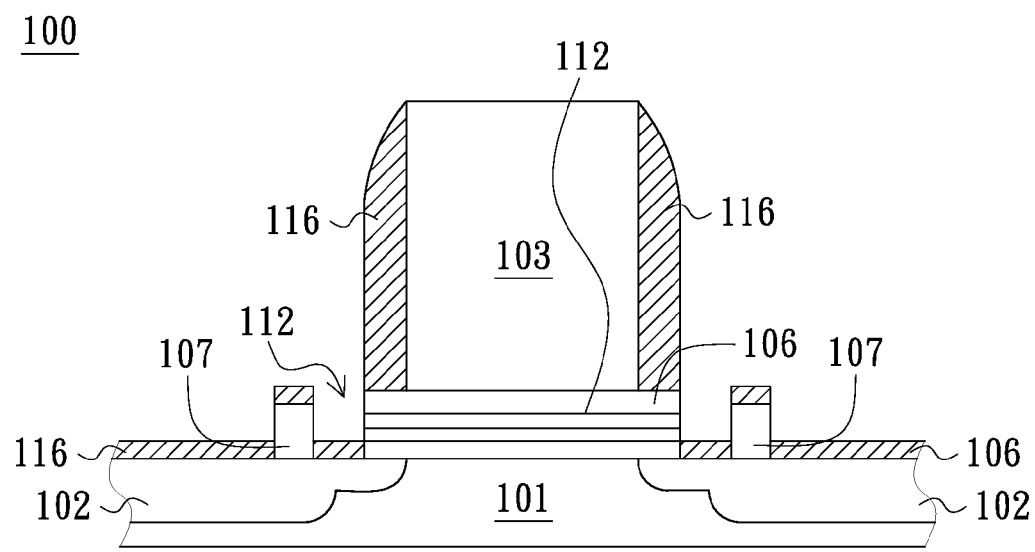

Subsequently, a gate oxide layer 106 is formed on the ONO structure and the substrate 101 (as shown in FIG. 1J); a gate electrode 103 and spacers 116 are formed on the gate oxide layer 106; and a source/drain 102 is then formed in the substrate 101, so as to form the SONOS non-volatile memory cell 100 (as shown in FIG. 1K).

However, because the ONO structure blankets over and beyond the opening 105, it is necessary to reserve a dimensional tolerance in the layout pattern of the SONOS non-volatile memory cells 100 and 120 to meet the process margin resulted from the formation processes of ONO structure and the opening 105. Accordingly, it is hard to decrease the distance G1 between the two gate electrodes 103 and 104 of the two adjacent SONOS non-volatile memory cells 100 and 120 and the device integrity may not be increased.

Furthermore, when the nitride hard mask layer 108 is removed, a portion of the substrate 101 is exposed by the opening 105, such that the hot $PO_4H_3$ which is used to removed the nitride hard mask layer 108 may damage the exposed substrate 101. Therefore, the yield may be adversely affected, additional cleaning processes used to remove $PO_4H_3$ may be required, and the manufacturing cost may significantly increased.

Figure 2:
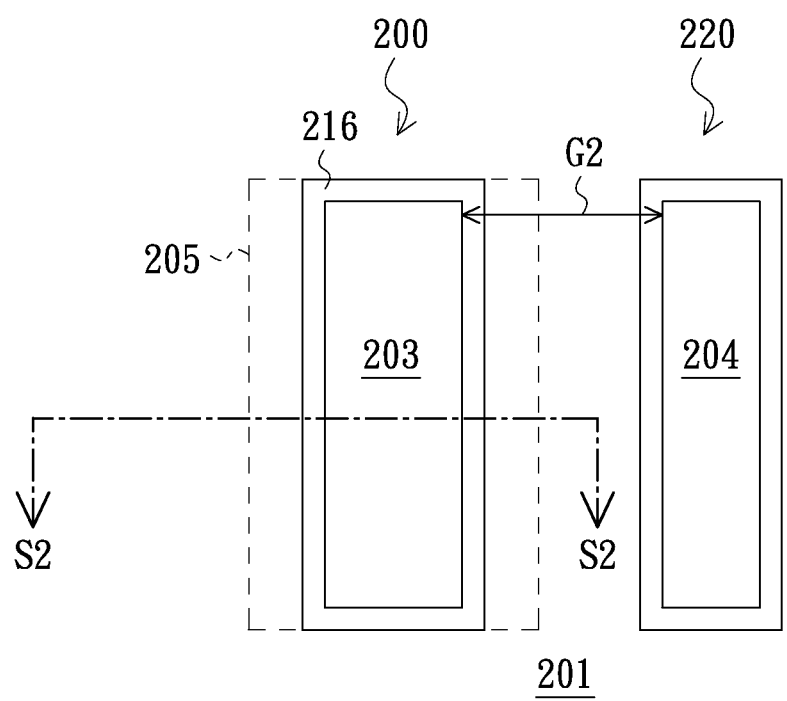
FIG. 2 illustrates a top view of two adjacent SONOS non-volatile memory cells in accordance one embodiment of the present invention.
Figure 2A:
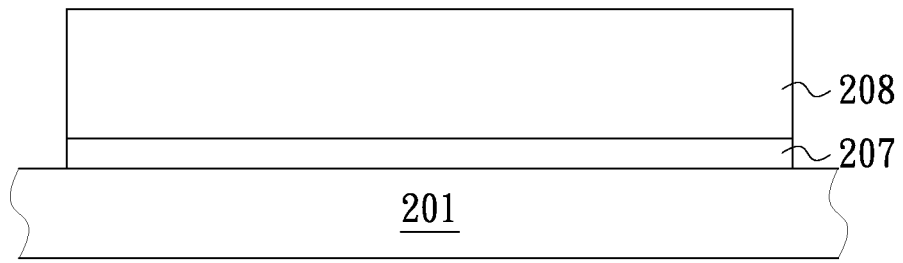
FIGS. 2A to 2J are cross sectional views depicted along the section line S2 to illustrate the method for fabricating the SONOS non-volatile memory cell as shown in FIG. 2.

FIG. 2 illustrates a top view of two adjacent SONOS non-volatile memory cells 200 and 220 in accordance with one embodiment of the present invention. FIGS. 2A to 2J are cross sectional views depicted along the section line S2 to illustrate the method for fabricating the SONOS non-volatile memory cell 200 as shown in FIG. 2. The method for fabricating the SONOS non-volatile memory cell 200 comprises steps as following: A pad oxide layer 207 and a first hard mask layer 208 are sequentially formed on a substrate 201 (as shown in FIG. 2A), wherein the substrate 201 preferably is a silicon substrate and the first hard mask layer 208 is made of silicon nitride. In some embodiment of the present invention, the first hard mask layer 208 has a thickness substantially greater than that of the pad oxide layer 207. The thickness of the first hard mask layer 208 ranges from 450 Å to 600 Å. In the present embodiment, the first hard mask layer 208 has a thickness about 500 Å.

Figure 2B:
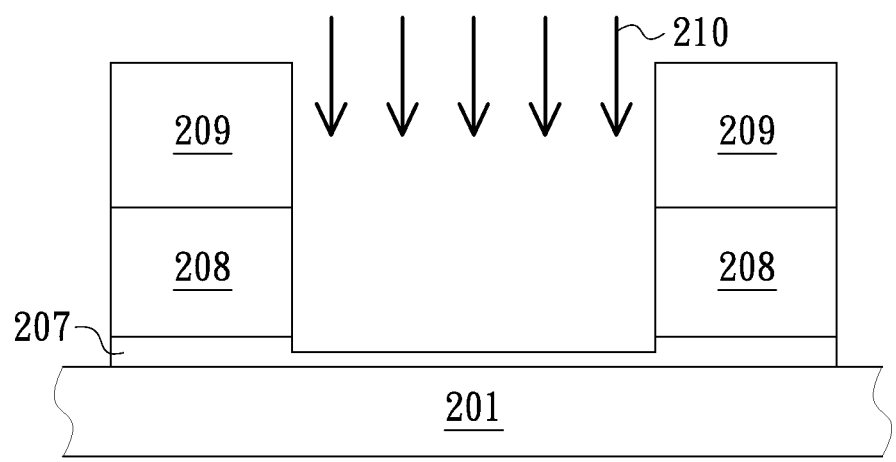
Figure 2C:
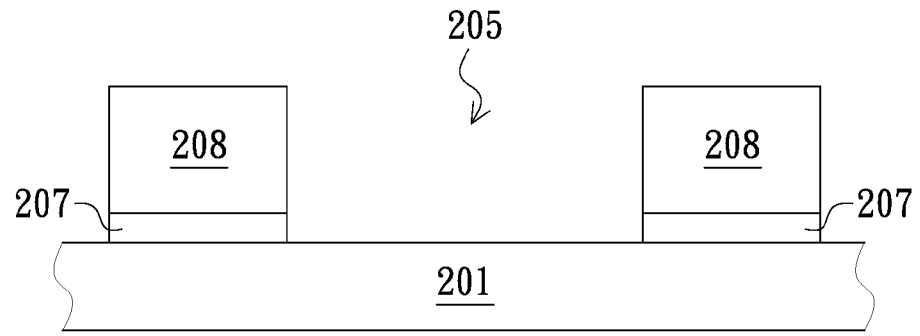

Next, a photoresist 209 is formed on the first hard mask layer 208 and a photolithography process is then performed to form an opening 205 penetrating through the first hard mask layer 208 and the pad oxide layer 207 to expose a portion of the substrate 201. In some embodiments of the present invention, the formation of the opening 205 comprises steps as following: A dry etching process, such as a reactive ion etching (RIE) process, is performed to etching through the first hard mask layer 208 so as to expose a portion of the pad oxide layer 207. An ion implant process 210 is then carried out on the exposed pad oxide layer 207 to drive a certain amount of ion dopants into the substrate 201 according to the requirement of the device containing the SONOS non-volatile memory cell 200 (as shown in FIG. 2B). Subsequently, the exposed pad oxide layer 207 is removed by a buffer oxide etchant (BOE) containing ammonium fluoride (NH4F) and hydrofluoric acid (HF), whereby a portion of the substrate 201 is exposed from the opening 205 (as shown in FIG. 2C).

Figure 2D:
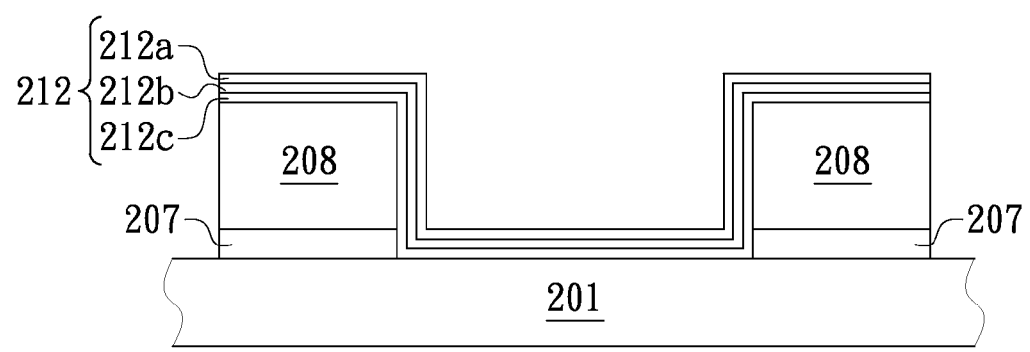

After the opening 205 is formed, an ONO layer 212 is formed on the first hard mask layer 208 and the exposed portion of the substrate 201. In some embodiments of the present invention, the ONO layer 212 consists of a bottom oxide layer 212c, a nitride layer 212b and a upper oxide layer 212a stacking in series (as shown in FIG. 2D). In the present embodiment, the thickness of the ONO layer 212 is substantially less than that of the first hard mask layer 208.

Figure 2E:
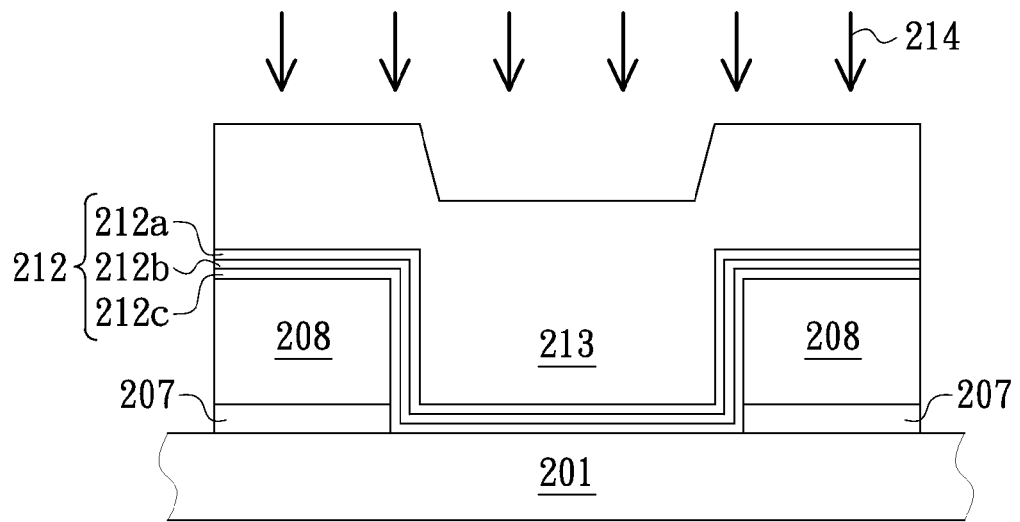
Figure 2F:
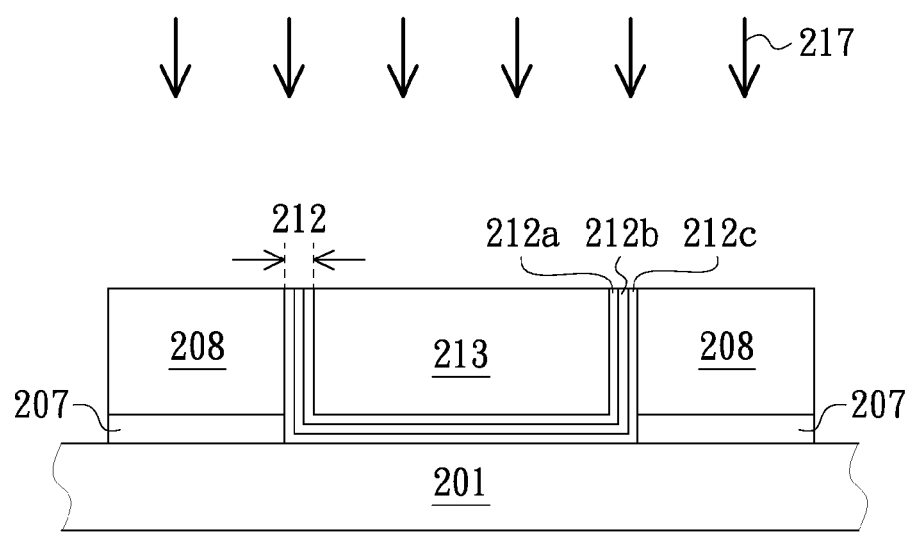

A second hard mask layer 213 is then formed over the ONO layer 212. A CMP process 214 is subsequently performed on the second hard mask layer 213 by using the first hard mask layer 208 serves as a polishing mask (as shown in FIG. 2E), whereby the portion of the second hard mask layer 213 remaining in the recess 205 is coplanar to the first hard mask layer 208, as shown in FIG. 2F. In some embodiments of the present invention, the second hard mask layer 213 is an oxide layer formed by a thermal oxidation process.

Figure 2G:
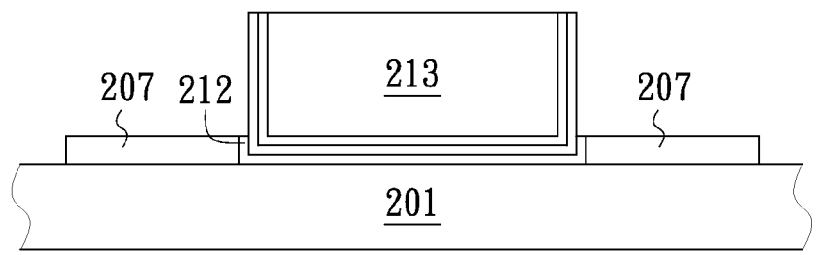
Figure 2H:
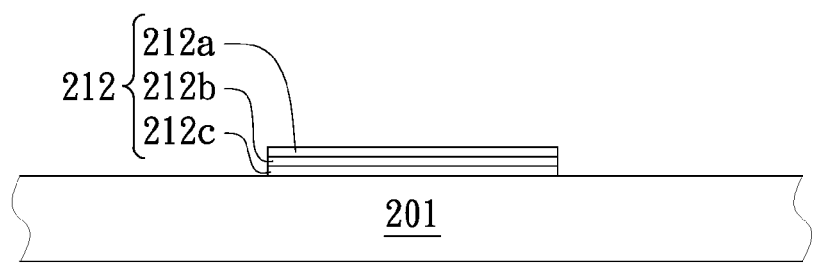

Afterward, the first hard mask layer 208 disposed on the pad oxide layer 207 is removed by a reagent containing hot $PO_4H_3$ (as shown in FIG. 2G), and then a RCA cleaning process is carried out to remove the remaining second hard mask layer 213 disposed on the ONO layer 212 and the pad oxide layer 207 disposed on the substrate 201, thereby an ONO structure as shown in FIG. 2H is formed.

Because the portion of the substrate 201 exposed by the opening 205 has been blanketed prior the first hard mask layer is removed, such that when the hot $PO_4H_3$ is imposed to remove the first hard mask 208, the substrate 201 can not be damaged. Thus the reaction interval of the hot $PO_4H_3$ may be extended for the purpose of thoroughly removing the silicon nitride residue remaining on the shallow trench isolator (not shown) which may result in the problems of reducing the effective channel width of the device.

In addition, in comparison with the prior art approach, the ONO layer 212 can be patterned without considering the deviations of reticule alignment and the CMP process 214 requires no photoresist. In other words, the embodiments of the preset invention can achieve the same results as the prior art dose with a simplified process.

Figure 2I:
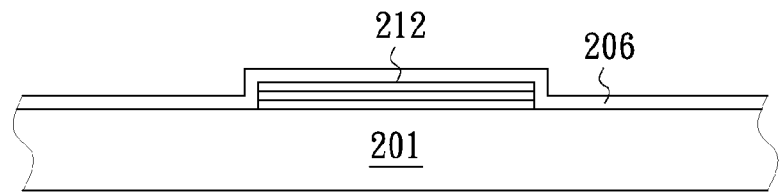
Figure 2J:
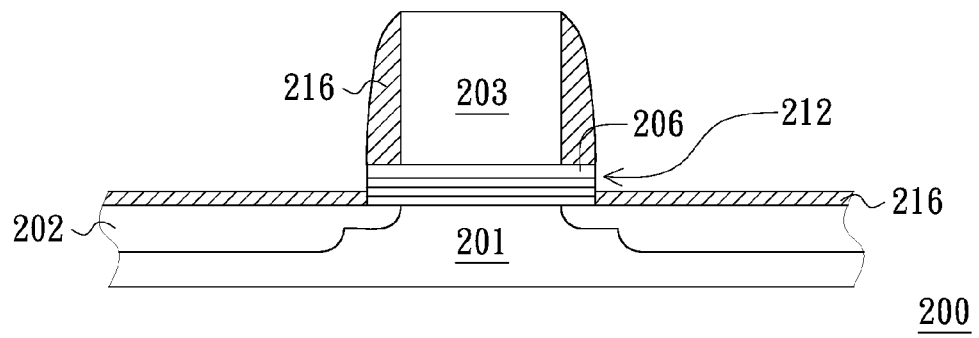

Thereafter, a gate oxide layer 206 conformal to the substrate 201 and the ONO structure is formed (as shown in FIG. 2I); a gate electrode 203 and spacers 216 are respectively formed on the gate oxide layer 206 by a silicon deposition and a thermal oxidation process; and a source/drain 202 is formed in the substrate 201 by a series ion implant process, while the SONOS non-volatile memory cell 200 as shown in FIG. 2J is completed.

Referring to FIG. 2 again, since the ONO structure has a size substantially less than or equal to (preferably coincides with) thus the process margin resulted from the formation processes of the ONO structure and the opening 205 is no more necessary to be considered while manufacturing the SONOS non-volatile memory cell 200, such that the feature size of the individual SONOS non-volatile memory cell 200 fabricated on an electronic device can be minimized and the integrity of the electronic device can be increased. Therefore, the distance G2 between the gate electrodes 203 and 204 of the two adjacent SONOS non-volatile memory cell 200 and 220 can be effectively reduced, and the density of the SONOS non-volatile memory cells fabricated on the device can be increased.

In accordance with the aforementioned embodiments of the present invention, an etching process is performed to form an opening penetrating through a pad oxide layer and a nitride hard mask layer so as to expose a substrate, and a CMP process is then carried out by using the hard mask as a polishing layer to pattern an ONO layer subsequently formed on the ONO layer and fill in the opening, thereby an ONO structure with a size substantially less than or equal to the opening directly blanket over the exposed portion of the substrate is formed, instead of using two etching process to form the opening and pattern the ONO layer, like the prior art dose.

Because the ONO structure substantially coincides with the opening. Therefore, the process margin resulted from the formation processes of the ONO structure and the opening is no more necessary to be considered while manufacturing the SONOS non-volatile memory cells, such that the feature size of an individual SONOS non-volatile memory cell fabricated on an electronic device can be minimized and the density of the SONOS non-volatile memory cells fabricated on integrity of the same electronic device can be increased. In addition, because the substrate exposed by the opening is blanketed by the ONO layer when the hard mask is removed by using hot $PO_4H_3$ serves as the etchant, the exposed substrate thus can be prevented from damage of the hot $PO_4H_3$ and it is no more necessary to require additional $PO_4H_3$ cleaning processes. Furthermore, because the etching step for patterning the ONO layer is substituted by the CMP process, the cost of the photolithographic steps and masks can thus be reserved and the yield may be increased. Therefore, drawbacks and problems encountered from the prior art can be solved and the aforementioned objections can be achieved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a silicon-oxide-nitride-oxide-silicon (SONOS) non-volatile memory cell comprising:
   forming a pad oxide layer and a first hard mask layer sequentially stacked on a substrate, wherein the pad oxide layer is directly in contact with the substrate;
   etching through the pad oxide layer and the first hard mask layer, so as to form an opening exposing a portion of the substrate;
   forming an oxide-nitride-oxide (ONO) layer on the first hard mask and the exposed portion of the substrate;
   forming a second hard mask layer on the ONO layer;
   performing a chemical mechanical polishing (CMP) by using the first hard mask as a polishing stop layer;
   removing the first hard mask layer; and
   removing the remaining second hard mask layer and the pad oxide layer, so as to form an ONO structure with a size substantially less than or equal to the opening to coincide with the portion of the substrate exposed by the opening, wherein the ONO structure is directly in contact with the exposed portion of the substrate.

2. The method for fabricating the SONOS non-volatile memory cell according to claim 1, wherein the first hard mask layer is a nitride layer.

3. The method for fabricating the SONOS non-volatile memory cell according to claim 1, wherein the first hard mask layer has a thickness substantially greater than that of the ONO structure.

4. The method for fabricating the SONOS non-volatile memory cell according to claim 3, wherein the thickness of the first hard mask layer ranges from 450 Å to 600 Å.

5. The method for fabricating the SONOS non-volatile memory cell according to claim 1, wherein the formation of the opening comprises following steps:
   etching through the first hard mask layer, to expose a portion of the pad oxide;
   performing an ion implant process on the exposed pad oxide; and
   removing the exposed pad oxide layer to expose the substrate.

6. The method for fabricating the SONOS non-volatile memory cell according to claim 1, wherein the formation of the opening comprises steps of removing the exposed pad oxide layer by a buffer oxide etchant (BOE).

7. The method for fabricating the SONOS non-volatile memory cell according to claim 1, wherein the second hard mask layer is an oxide layer formed by a thermal oxidation process.

8. The method for fabricating the SONOS non-volatile memory cell according to claim 1, wherein the first hard mask layer is removed by a reagent containing hot $PO_4H_3$.

9. The method for fabricating the SONOS non-volatile memory cell according to claim 1, wherein the second hard mask layer is removed by a RCA cleaning process.

10. The method for fabricating the SONOS non-volatile memory cell according to claim 1, further comprising steps as following:
- forming a gate oxide layer conformal to the substrate and the ONO structure;
- forming a gate electrode on the gate oxide layer; and
- forming a source/drain in the substrate.

* * * * *